United States Patent
Maloney et al.

(10) Patent No.: US 8,281,279 B2
(45) Date of Patent: Oct. 2, 2012

(54) CREATING SCAN CHAIN DEFINITION FROM HIGH-LEVEL MODEL USING HIGH-LEVEL MODEL SIMULATION

(75) Inventors: William B. Maloney, Austin, TX (US); Timothy M. Skergan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 12/963,246

(22) Filed: Dec. 8, 2010

(65) Prior Publication Data

US 2012/0151288 A1     Jun. 14, 2012

(51) Int. Cl.
*G06F 17/50* (2006.01)
*G06F 11/22* (2006.01)
*G01R 31/28* (2006.01)

(52) U.S. Cl. .................. 716/136; 714/726; 714/727
(58) Field of Classification Search .............. 716/136; 714/726, 727
See application file for complete search history.

(56) References Cited

U.S. PATENT DOCUMENTS

| | | | |
|---|---|---|---|
| 7,266,489 B2 | 9/2007 | Hunt et al. | |
| 7,496,816 B2 | 2/2009 | Bartenstein et al. | |
| 8,086,923 B2 * | 12/2011 | Cheng et al. | 714/726 |
| 2004/0098239 A1 | 5/2004 | Guettaf | |
| 2005/0114747 A1 | 5/2005 | Brunkhorst et al. | |
| 2005/0138514 A1 * | 6/2005 | Burdine et al. | 714/733 |
| 2007/0043989 A1 * | 2/2007 | Yokota | 714/726 |
| 2008/0235544 A1 * | 9/2008 | Lai et al. | 714/729 |
| 2009/0138772 A1 * | 5/2009 | Bertacco et al. | 714/733 |
| 2009/0210763 A1 * | 8/2009 | Eckelman et al. | 714/731 |
| 2009/0217116 A1 | 8/2009 | Motika et al. | |
| 2010/0095169 A1 * | 4/2010 | Forlenza et al. | 714/726 |
| 2011/0099442 A1 * | 4/2011 | Hales et al. | 714/729 |
| 2011/0307750 A1 * | 12/2011 | Narayanan et al. | 714/729 |

OTHER PUBLICATIONS

Chun et al.; "DiSC: A New Diagnosis Method for Multiple Scan Chain Failures"; Nov. 19, 2010; IEEE Transactions on Computer-Aided Design of Integrated Circuits and Systems, vol. 29, No. 12; pp. 1-5.*

* cited by examiner

*Primary Examiner* — Suresh Memula
(74) *Attorney, Agent, or Firm* — Stephen R. Tkacs; Stephen J. Walder, Jr.; Matthew B. Talpis (57) ABSTRACT

Mechanisms are provided for creating shift register definition from high-level model using high-level model simulation. The mechanisms initialize all potential scan chain latches, identify the latches in a given scan chain, and separate the scan chain latches into chunks. For each chunk, the mechanisms identify the latches within the chunk that change at each shift. The mechanisms isolate the scan path latch when divergence occurs.

20 Claims, 6 Drawing Sheets

CREATING SCAN CHAIN DEFINITION FROM HIGH-LEVEL MODEL USING HIGH-LEVEL MODEL SIMULATION

BACKGROUND

The present application relates generally to an improved data processing apparatus and method and more specifically to mechanisms for creating shift register definition from high-level model using high-level model simulation.

Design for Test (DFT) is a name for design techniques that add certain testability features to a microelectronic hardware product design. The premise of the added features is that they make it easier to develop and apply manufacturing tests for the designed hardware. The purpose of manufacturing tests is to validate that the product hardware contains no defects that could adversely affect correct functioning.

A scan chain is a technique used in Design for Test. The objective is to make testing easier by providing a simple way to set and observe every flip-flop in an integrated circuit (IC). When a scan enable signal is asserted, every flip-flop in the design is connected into a long shift register. One input pin provides the data to this chain, and one output pin connects to the output of the chain. Then, using the clock signal, a test device may enter an arbitrary pattern into the chain of flips flops, and read out the state of every flip flop.

SUMMARY

In one illustrative embodiment, a method, in a data processing system, is provided for creating a shift register definition from high-level model using high-level model simulation. The method comprises initializing, by the data processing system, all potential scan chain latches in a high-level integrated circuit model. The method further comprises for each scan chain, identifying, by the data processing system, latches in the scan chain. The method further comprises separating, by the data processing system, each scan chain into groups of latches. Each group of latches is a sub-portion of its respective scan chain. The method further comprises for each group of latches in a given scan chain, identifying, by the data processing system, latches that change after each shift until all groups of latches in the given scan chain are defined and ordered. The method further comprises responsive to the data processing system determining that a divergence occurs for the given scan chain, isolating, by the data processing system, a scan path latch for each shift with a divergence in the given scan chain.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a mechanism for creating shift register definition from high-level model using high-level model simulation. The mechanism uses simulation on the high-level model of the integrated circuit design. The simulation may be driven by the control files, such as Automatic Test Pattern Generation (ATPG) control files normally used during the test generation processes based on physical netlisted models. The simulation guarantees accurate model control in order to obtain the absolute scan chain connection list that is error free. The key component of the mechanism is the efficient extraction of high-level model latch differences as a result of any given shift in order to compile the list of the latch names for each scan chain active in the scan or test mode being evaluated. In addition to providing the latch list, the mechanism validates the scan mode. Furthermore, in the event of a design error, the mechanism allows the automatic creation of the appropriate debug "events trace."

Figure 1:
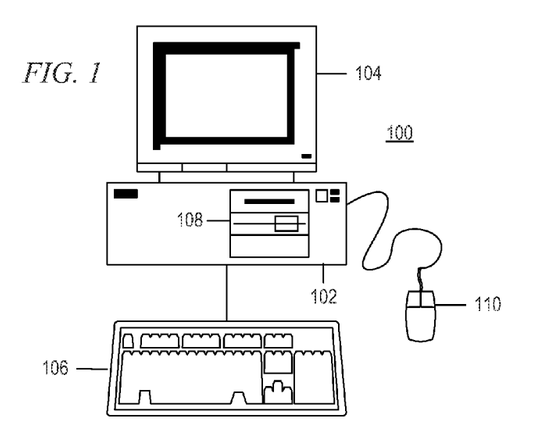
FIG. 1 is a pictorial representation of a data processing system in which the present invention may be implemented in accordance with an illustrative embodiment.
Figure 2:
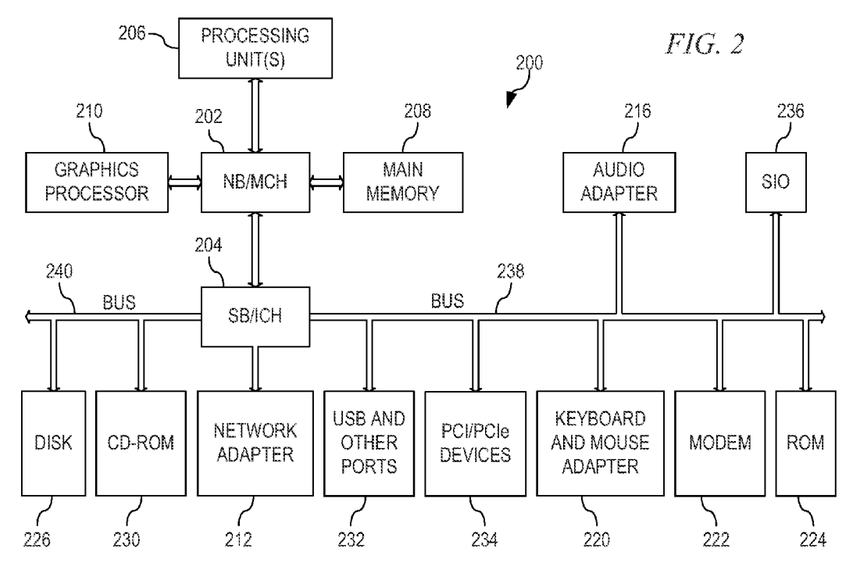
FIG. 2 is a block diagram of an example data processing system in which aspects of the illustrative embodiments may be implemented.

Thus, the illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as example environments in which aspects of the illustrative embodiments may be implemented. While the description following FIGS. 1 and 2 will focus primarily on a single data processing device implementation, this is only an example and is not intended to state or imply any limitation with regard to the features of the present invention. To the contrary, the illustrative embodiments are intended to include distributed data processing environments and embodiments.

With reference now to the figures and in particular with reference to FIGS. 1 and 2, example diagrams of data processing environments are provided in which illustrative embodiments of the present invention may be implemented. It should be appreciated that FIGS. 1 and 2 are only examples and are not intended to assert or imply any limitation with regard to the environments in which aspects or embodiments of the present invention may be implemented. Many modifications to the depicted environments may be made without departing from the spirit and scope of the present invention.

FIG. 1 is a pictorial representation of a data processing system in which the present invention may be implemented in accordance with an illustrative embodiment. A computer 100 includes system unit 102, video display terminal 104, keyboard 106, storage devices 108, which may include floppy drives and other types of permanent and removable storage media, and mouse 110. Computer 100 may include additional input devices, such as, for example, a joystick, a touchpad, a touch screen, a trackball, a microphone, or the like. Computer 100 can be implemented using any suitable computer, such as a desktop client computer or server system. Although the depicted representation shows a computer, other embodiments of the present invention may be implemented in other types of data processing systems, such as a network computer. Computer 100 also preferably includes a graphical user interface (GUI) that may be implemented by means of systems software residing in computer readable media in operation within computer 100.

FIG. 2 is a block diagram of an example data processing system in which aspects of the illustrative embodiments may be implemented. Data processing system 200 may be an example of a computer, such as computer 100 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® 7 (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Oracle and/or its affiliates in the United States, other countries, or both).

As a server, data processing system 200 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Torvalds in the United States, other countries, or both). Data processing system 200 may be a symmetric multiprocessor (SUP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1 and 2 may vary depending on the implementation. Other internal hardware or peripheral devices, such as flash memory, equivalent non-volatile memory, or optical disk drives and the like, may be used in addition to or in place of the hardware depicted in FIGS. 1 and 2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

Designing and testing a microprocessor design, there is a need to generate a list of the latch names for scan chains, sometimes referred to as shift registers, in the design from the high-level simulation model. Existing solutions are based on model tracing. The inherent problem with using model tracing to generate lists of latches in scan chains is a requirement to inject control information to steer the tracing, in practice, the mechanisms for doing this have proved imperfect and unreliable. Human involvement to understand each failure of the tracing impacts schedules and deliverables. A more reliable method would, for instance, allow advanced Automatic Test Pattern Generation (ATPG) work on the high-level model in order to feedback testability improvements into the designs before the designs are locked down.

In accordance with an illustrative embodiment, simulation drives a blanket load of all the scan chains active in a given test mode based on the directions provided by the ATPG control files normally used during the test generation processes. The mechanism of the illustrative embodiment then notes the state of the latches. Then, after a sub-portion scan of the opposite value from the blanket load into a single scan chain, the mechanism gathers list of the different latches. The mechanism gathers groups of differing latches from subsequent sub-portions.

After gathering the list of possible latches in the scan chain by sub-portion, the mechanism determines the precise ordering of latch names on each sub-portion. After each bit shift, the mechanism checks all latches from the associated sub-portion list of latch names. Having the smaller sub-portion list to search makes it practical even for use on the latest version of microprocessors, which may have 400,000 bit chain lengths, and in practice there is not an inherent length limitation.

One final step to resolve divergent cases is to examine each position that contains a divergence and to observe which latch in the divergent list effects change in a latch feeding to the scan output, which results in a singular event per divergent location. Hence, the execution time for resolving divergent cases is very rapid.

Figure 3A:
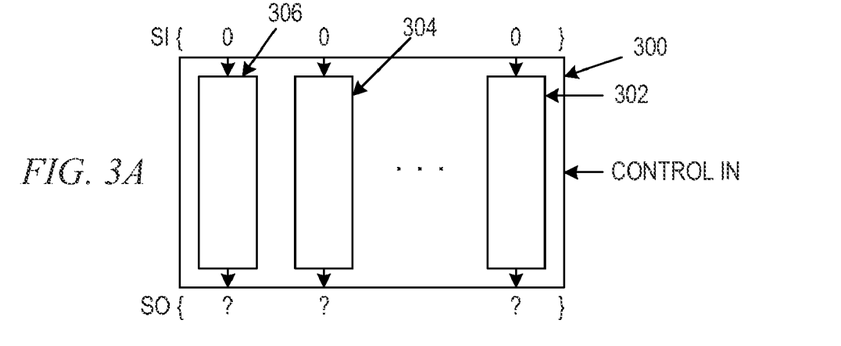
FIGS. 3A-3F are block diagrams depicting creation of scan chain definitions in a high-level design in accordance with an illustrative embodiment.

FIGS. 3A-3F are block diagrams depicting creation of scan chain definitions in a high-level design in accordance with an illustrative embodiment. With reference to FIG. 3A, in a simulation of the high-level design, a mechanism shifts a constant logic value, for example zeros in this illustrative embodiment, into the scan inputs. The design 300 comprises scan chains 302, 304, 306. Each scan input (SI) feeds a chain of latches, one after the other, eventually feeding a corresponding scan output (SO), all driven by the scan clocks, pulsed once for each scan shift. Given a simple data flow, determining the latches in each chain is to simply identify the latches that change at each scan shift. Though the concept is simple, the process of identifying the changing latches is prohibitively time consuming in today's large microprocessor designs with more than four million total latches and chain sizes greater than 100,000 latches, and some as large as 400,000 latches. Checking each of four million latches, for each shift of 100,000 latches, for each of thirty-two chains is not feasible.

With reference to FIG. 3A, the mechanism of the illustrative embodiment all potential latches by setting a logic zero at all scan inputs and applying the scan shift N times, where N is large enough to fill all scan chains. The value of N conservatively defaults to the number of latches, but can be overridden if the user has a feel for maximum chain lengths. The mechanism then saves the state of all latches and all scan outputs.

Figure 3B:
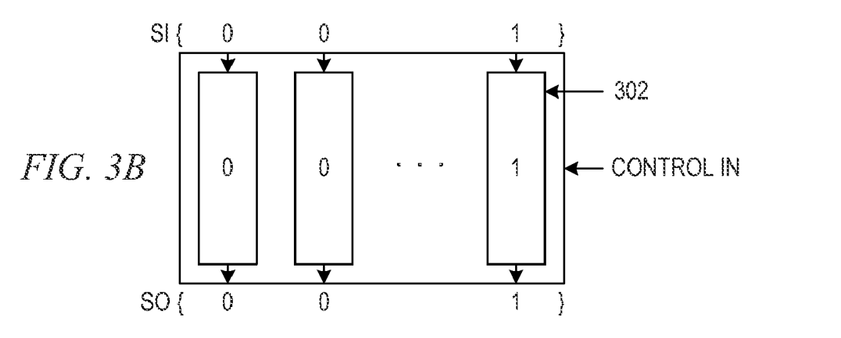

Turning to FIG. 3B, the mechanism identifies chain latches by setting a logic one at the scan input of a scan chain in question, in this case scan chain 302, leaving all other scan inputs at their previous state. Only scan chain 302 shifts and changes. The mechanism shifts the chain N times or until a circuit scan output changes state. If no scan output, or more than one scan output, changes, then the chain in question is broken; otherwise, the length of the chain is the number of shifts applied, S. Then, the mechanism identifies the set of latches that changed during the single chain shifts, saving the new states of the changed latches.

Figure 3C:
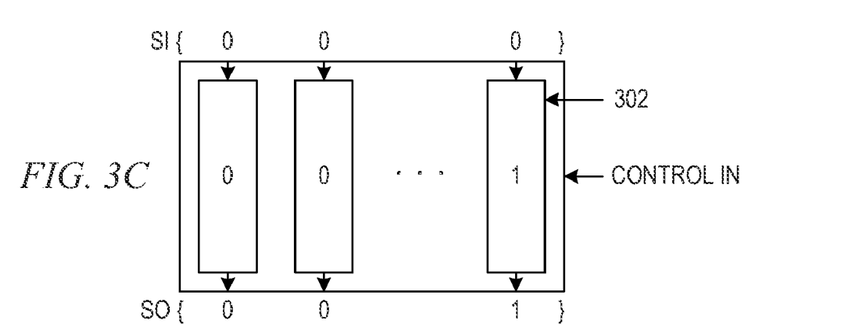
Figure 3D:
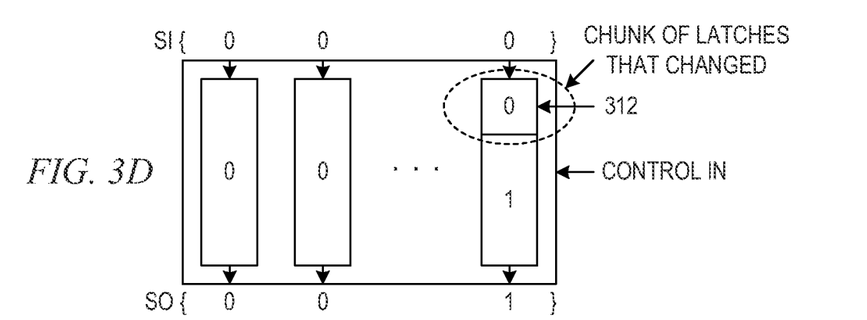

With reference now to FIG. 3C, the mechanism separates the chain latches into chunks, or sub-portions. The mechanism sets a logic zero at the chain scan input of the scan chain in question, and applies the scan clocks for S shifts, stopping after C shifts to identify the latches that changed for each set of C shifts, where the value of C is a predetermined chunk size. The mechanism saves the new states of the changed latches. The mechanism separates the latches into groups, each group only containing the latches that changed during a particular chunk of shifts. As seen in FIG. 3D, the group of latches 312 is the "chunk" of latches that has changed.

Figure 3E:
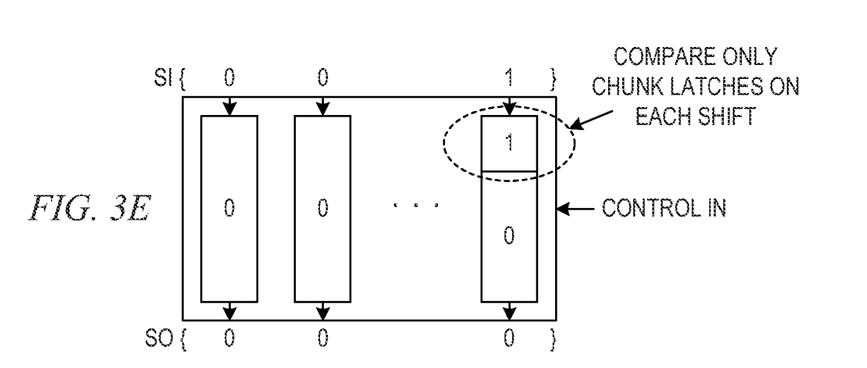

As depicted in FIG. 3E, the mechanism identifies the latches that change at each shift. After the mechanism has shifted a logic zero through chunk 312 and all subsequent chunks of the scan chain 302, resulting in a zero being shifted to the scan output, the mechanism sets a logic one at the scan input and applies the scan clocks for S shifts. This time, the mechanism checks the latches after each single shift, but only checks the set of latches identified as being within a given chunk of latches, such as chunk 312. This isolates latches that change for each individual shift and, thus, the ordering and definition of the scan chain 302. However, because the mechanism separates scan chains into chunks, the mechanism compares perhaps 256 latches rather than 100,000 or even 400,000 latches. This greatly reduces the computational cost for defining scan chains.

Figure 3F:
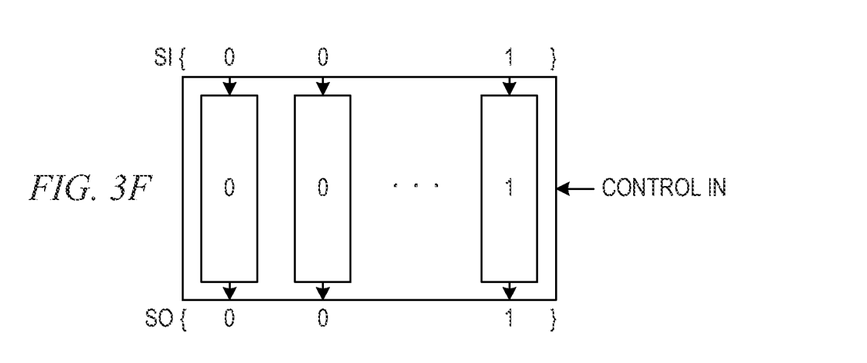

With reference now to FIG. 3F, the mechanism isolates a scan path latch when divergence occurs. It is possible that multiple matches may change at any single shift. This divergence along the scan chain must be further analyzed to isolate the single latch that feeds to the scan output, because only one is allowable by scan design. The mechanism proceeds from the scan output backwards down the scan chain. For each shift, SS, with divergence, and for each potentially divergent latch, SL, the mechanism sets latch SL to a logic zero, pulses the scan clocks, and checks the state of the latch at scan position SS+1, which may be the scan output for divergences at the last scan position. Then, the mechanism sets latch SL to a logic one, pulses the scan clocks, and checks the state of the latch at scan position SS+1. If the scan chain latch at position SS+1 changes consistently with latch SL, either in phase or out, then latch SL is the single latch at scan position SS that feeds the scan output.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 4A:
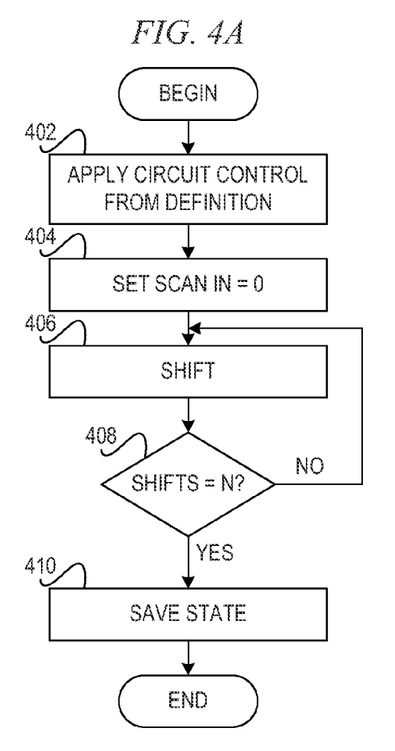
FIGS. 4A-4E are flowcharts illustrating operation of a mechanism for creating of scan chain definitions in a high-level design in accordance with an illustrative embodiment.

FIGS. 4A-4E are flowcharts illustrating operation of a mechanism for creating of scan chain definitions a high-level design in accordance with an illustrative embodiment. More particularly, FIG. 4A illustrates operation of a mechanism for initializing all potential scan chain latches in accordance with an illustrative embodiment. Operation begins, and the mechanism applies circuit control from the high-level integrated circuit (IC) definition (block 402). The mechanism sets the scan inputs of all scan chains to a logic zero (block 404) and shifts all scan chains (block 406). The mechanism determines whether the number of shifts is equal to N (block 408), where the value of N is a predetermined value that is high enough to be equal to or greater than the longest scan chain in the IC design. If the number of shifts is not equal to N operation returns to block 406 to shift the scan chains. If the number of shifts is equal to N in block 408, the mechanism saves the state of all latches and all scan outputs (block 410), and operation ends.

Figure 4B:
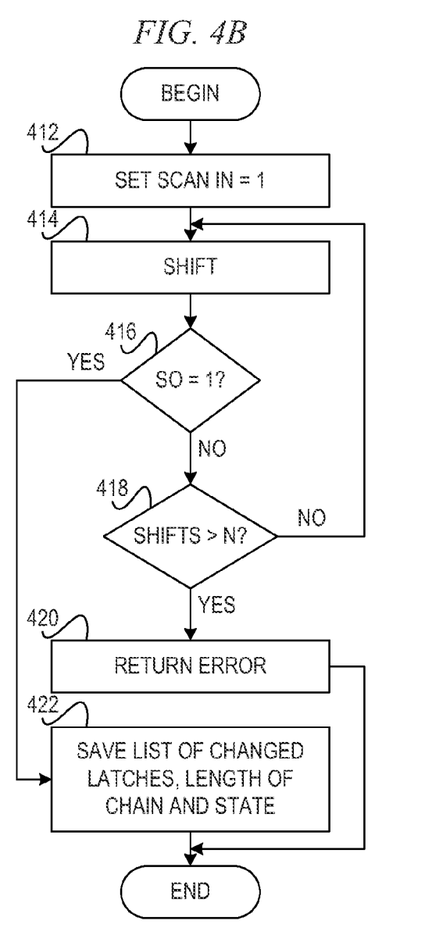

FIG. 4B illustrates operation of a mechanism for identifying scan chain latches in accordance with an illustrative embodiment. Operation begins, and the mechanism sets the scan input for a given scan chain to a logic one (block 412) and applies shift clocks (block 414). Shift clocks to all scan chains are applied; however, because only one scan input is uniquely changed while all other scan inputs are held to their previous value then only one scan chain shifts. The mechanism determines whether any scan output for the given set of circuit scan outputs is a logic one (block 416). If any scan output is not a logic one, the mechanism determines whether the number of shifts is greater than N (block 418). If the number of shifts is not greater than N, then operation returns to block 414 to shift the given scan chain. If the number of shifts is greater than N in block 418, the mechanism returns an error (block 420), and operation ends. Returning to block 416, if any scan output is equal to a logic one, the mechanism saves the list of changed latches, the length of the scan chain, and the states of the changed latches (block 422), and operation ends. The length of the scan chain is the number of shifts applied, S. The mechanism may perform the operations in FIG. 4B for each scan chain in the design before proceeding to flowchart shown in FIG. 4C.

Figure 4C:
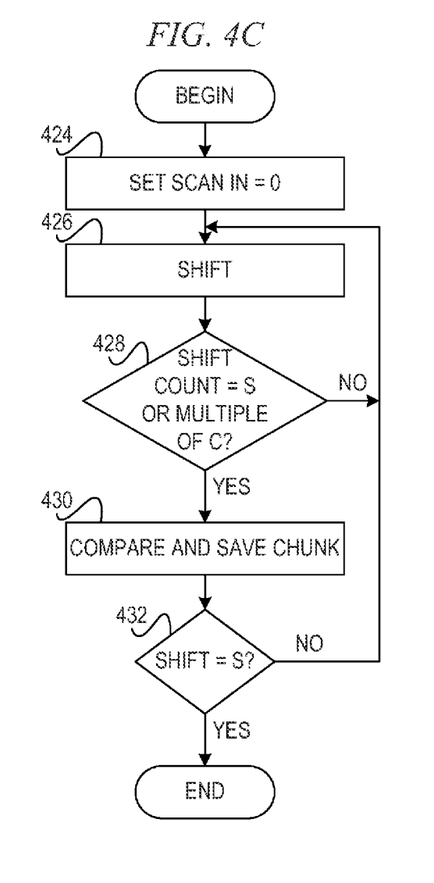

FIG. 4C illustrates operation of a mechanism for separating a given scan chain into chunks in accordance with an illustrative embodiment. Operation begins, and the mechanism sets the scan input for the given scan chain to a logic zero (block 424) and applies shift clocks (block 426) but only the given scan chain shifts due to the unique difference on the given scan input. The mechanism determines whether the shift count is equal to S or a multiple of the chunk size, C (block 428). If the shift count is not equal to S or a multiple C, operation returns to block 426 to shift the given scan chain.

If the shift count is equal to S or a multiple of C, the mechanism compares the latches in the scan chain to determine which latches changed and saves the identified changed latches as the chunk (block 430). Then, the mechanism determines whether the number of shifts is equal to S (block 432). If the number of shifts is not equal to S, then operation returns to block 426 to shift the given scan chain; otherwise, operation ends. The mechanism may perform the operations in FIG. 4C for each scan chain in the IC design before proceeding to the flowchart shown in FIG. 4D.

Figure 4D:
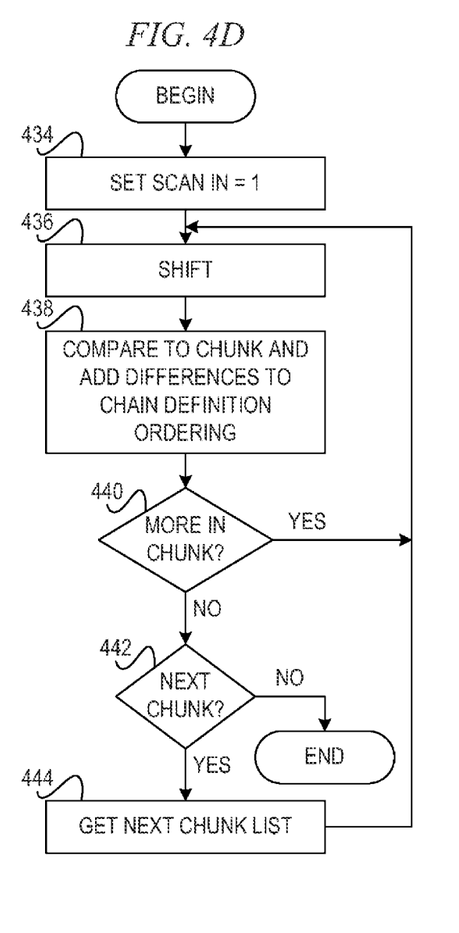

FIG. 4D illustrates operation of a mechanism for identifying the latches that changed at each shift in a given scan chain in accordance with an illustrative embodiment. Operation begins, and the mechanism sets the scan input for the given scan chain to a logic one (block 434) and applies shift clocks (block 436) but only the given scan chain shifts due to the unique difference on the given scan input. The mechanism compares the latches in the chunk after each shift and adds differences to chain definition ordering (block 438) to isolate the latches that change for each individual shift. The mechanism determines whether there are more shifts in the chunk (block 440). If there are more shifts in the chunk, operation returns to block 436 to shift the given scan chain.

If there are not more shifts in the chunk, the mechanism determines whether there is another chunk to analyze (block 442). If there is another chunk to analyze, then the mechanism gets the next chunk list (block 444), and operation returns to block 436 to shift the given scan chain. If there is not another chunk to analyze, then operation ends. The mechanism may perform the operations in FIG. 4D for each scan chain in the IC design before proceeding to the flowchart shown in FIG. 4E.

Figure 4E:
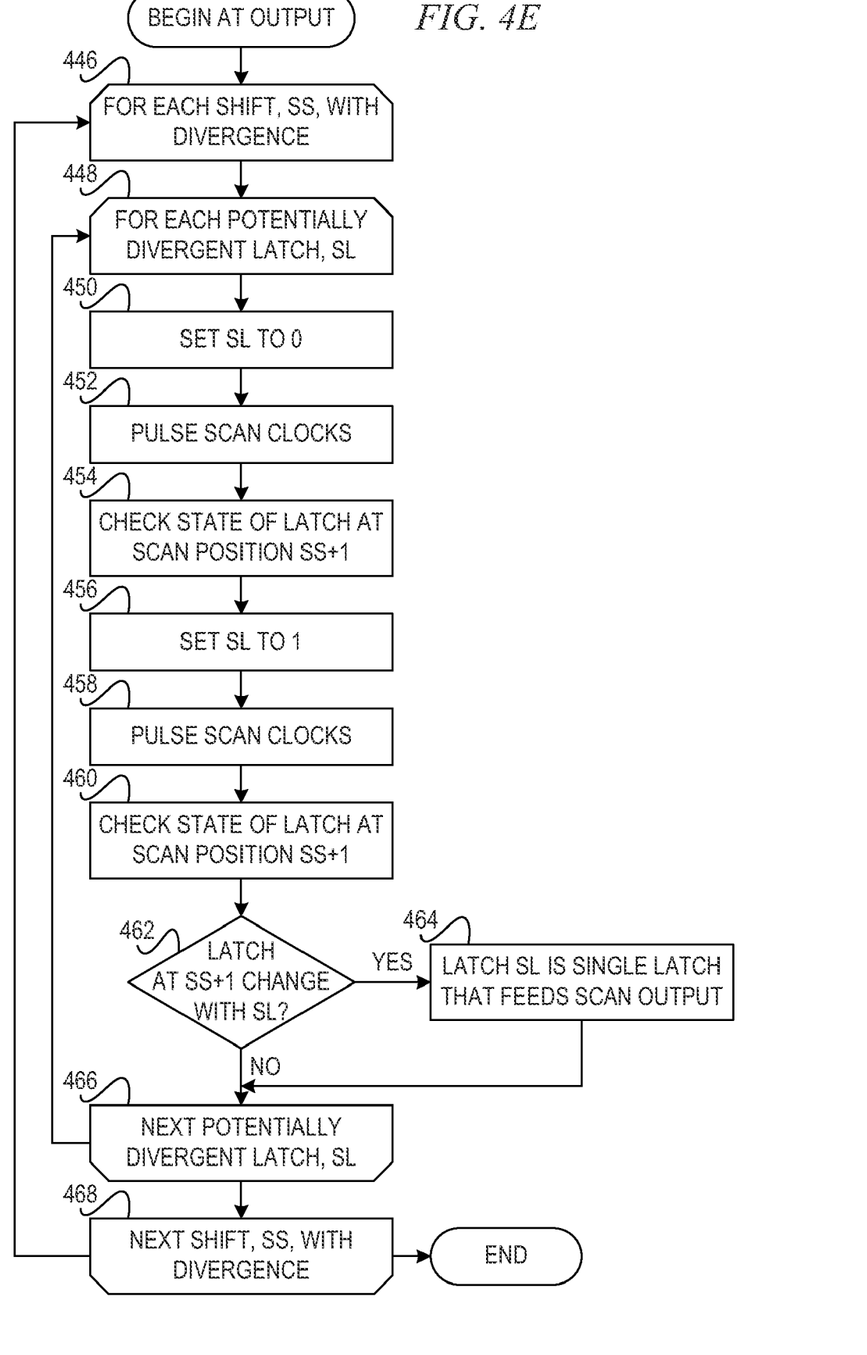

FIG. 4E is a flowchart illustrating operation of a mechanism for isolating scan path latches when divergence occurs in accordance with an illustrative embodiment. Operation begins at the scan output and proceeds backwards down a given scan chain. For each shill, SS, with divergence (block 446), and for each potentially divergent latch, SL (block 448), the mechanism sets SL to a logic zero (block 450). The mechanism then pukes the scan clocks in the given scan chain (block 452) and checks the state of the latch at scan position SS+1 (block 454) or scan output if at the last scan position. Then, the mechanism sets SL to a logic one (block 456), pulses the scan clocks (block 458), and checks the state of the latch at scan position SS+1 (block 460). The mechanism determines whether the latch at position SS+1 changes consistently with latch SL (block 462). If the latch at SS+1 does change consistently with SL, the mechanism determines that the latch SL is the single latch that feeds the scan output for the divergent scan position (block 464). Thereafter, or if the latch at SS+1 does not change with SL block 462, the mechanism considers the next potentially divergent latch, SL (block 466), and operation returns to block 448 to repeat blocks 450-464 for the next divergent latch. If the mechanism determines that the last divergent latch for the divergent shift has been considered in block 466, the mechanism considers the next shift, SS, with a divergence (block 468), and operation returns to block 446 to repeat blocks 448-466 for the next shift with a divergence. If the mechanism determines that the last shift with divergence has been considered in block 468, then operation ends.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments provide mechanisms for creating shift register definition from high-level model using high-level model simulation. The mechanisms initialize all potential scan chain latches, identify the latches in a given scan chain, and separate the scan chain latches into chunks. For each chunk, the mechanisms identify the latches within the chunk that change at each shift. The mechanisms isolate the scan path latch when divergence occurs.

As noted above, it should be appreciated that the illustrative embodiments may take the form of an entirety hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, executed by a data processing system, for creating a shift register definition from high-level model using high-level model simulation, the method comprising:

initializing, by the data processing system, all potential scan chain latches in a high-level integrated circuit model;

for each scan chain, identifying, by the data processing system, latches in the scan chain;

separating, by the data processing system, each scan chain into groups of latches, wherein each group of latches is a sub-portion of its respective scan chain;

for each group of latches in a given scan chain, identifying, by the data processing system, latches that change after each shift until all groups of latches in the given scan chain are defined and ordered; and responsive to the data processing system determining that a divergence occurs for the given scan chain, isolating, by the data processing system, a scan path latch for each shift with a divergence in the given scan chain.

2. The method of claim 1, wherein initializing all potential scan chain latches comprises:

initializing the high-level integrated circuit model to a scan state;

setting a logic value at all scan inputs in the high-level integrated circuit model;

applying a scan shift a predetermined number of times; and saving a state of all latches and all scan outputs.

3. The method of claim 2, wherein the predetermined number is equal to or greater than a length of a known longest scan chain.

4. The method of claim 2, wherein the predetermined number is equal to a number of latches in the high-level integrated circuit model.

5. The method of claim 1, wherein identifying the chain latches in a given scan chain comprises:
- changing a logic value at a scan input of the given scan chain;
- shifting the given scan chain a predetermined number of times or until a scan output of the given scan chain changes state;
- responsive to the scan output of the given scan chain changing state, determining a length of the given scan chain, wherein the length of the given scan chain is equal to the number of shifts;
- identifying a set of latches that changed; and
- saving the set of latches that changed and the length of the given scan chain.

6. The method of claim 1, wherein separating a given scan chain into groups of latches comprises:
- changing a logic value at a scan input of the given scan chain;
- shifting the given scan chain a predetermined number of times, wherein the predetermined number is a predetermined chunk size;
- identifying latches that changed to be a group of latches; and
- repeating shifting the given scan chain the predetermined number of times and identifying latches that changed until the given scan chain has been shifted.

7. The method of claim 1, wherein identifying latches that change after each shift in a given scan chain comprises:
- changing a logic value at a scan input of the given scan chain;
- for each group of latches in the given scan chain, shifting the given scan chain, comparing the group of latches to identify one or more changed latches, and updating a definition of the given scan chain to order latches in the given scan chain to form an updated scan chain definition; and
- storing the updated scan chain definition for the given scan chain.

8. The method of claim 1, wherein isolating a scan path latch for each shift with a divergence in the given scan chain comprises:
- starting at a scan output of the given scan chain;
- for each shift with a divergence, and for each potentially divergent latch:
  - setting the potentially divergent latch to a first logic value;
  - pulsing scan clocks in the given scan chain;
  - checking a state of a latch at a position of the shift with divergence plus one or scan output if last position;
  - setting the potentially divergent latch to a second logic value;
  - pulsing scan clocks in the given scan chain;
  - checking the state of the latch at the position of the shift with divergence plus one or scan output if last position;
  - responsive to a determination that the latch at the position of the shift with divergence plus one or scan output if last position changes consistently with the potentially divergent latch, identifying the potentially divergent latch as the scan path latch that feeds the scan output of the given scan chain.

9. A computer program product comprising a computer readable storage medium having a computer readable program stored therein, wherein the computer readable program, when executed on a computing device, causes the computing device to:
- initialize, by the computing device all potential scan chain latches in a high-level integrated circuit model;
- for each scan chain, identify, by the computing device, latches in the scan chain;
- separate, by the computing device, each scan chain into groups of latches, wherein each group of latches is a sub-portion of its respective scan chain;
- for each group of latches in a given scan chain, identify, by the computing device, latches that change after each shift until all groups of latches in the given scan chain are defined and ordered; and
- responsive to the data processing system determining that a divergence occurs for the given scan chain, isolate, by the computing device, a scan path latch for each shift with a divergence in the given scan chain.

10. The computer program product of claim 9, wherein initializing all potential scan chain latches comprises:
- initializing the high-level integrated circuit model to a scan state;
- setting a logic value at all scan inputs in the high-level integrated circuit model;
- applying a scan shift a predetermined number of times; and
- saving a state of all latches and all scan outputs.

11. The computer program product of claim 9, wherein identifying the chain latches in a given scan chain comprises:
- changing a logic value at a scan input of the given scan chain;
- shifting the given scan chain a predetermined number of times or until a scan output of the given scan chain changes state;
- responsive to the scan output of the given scan chain changing state, determining a length of the given scan chain, wherein the length of the given scan chain is equal to the number of shifts;
- identifying a set of latches that changed; and
- saving the set of latches that changed and the length of the given scan chain.

12. The computer program product of claim 9, wherein separating a given scan chain into groups of latches comprises:
- changing a logic value at a scan input of the given scan chain;
- shifting the given scan chain a predetermined number of times, wherein the predetermined number is a predetermined chunk size;
- identifying latches that changed to be a group of latches; and
- repeating shifting the given scan chain the predetermined number of times and identifying latches that changed until the given scan chain has been shifted.

13. The computer program product of claim 9, wherein identifying latches that change after each shift in a given scan chain comprises:
- changing a logic value at a scan input of the given scan chain;
- for each group of latches in the given scan chain, shifting the given scan chain, comparing the group of latches to identify one or more changed latches, and updating a definition of the given scan chain to order latches in the given scan chain to form an updated scan chain definition; and storing the updated scan chain definition for the given scan chain.

14. The computer program product of claim 9, wherein isolating a scan path latch for each shift with a divergence in the given scan chain comprises:
 starting at a scan output of the given scan chain;
 for each shift with a divergence, and for each potentially divergent latch:
  setting the potentially divergent latch to a first logic value;
  pulsing scan clocks in the given scan chain;
  checking a state of a latch at a position of the shift with divergence plus one or scan output if last position;
  setting the potentially divergent latch to a second logic value;
  pulsing scan clocks in the given scan chain;
  checking the state of the latch at the position of the shift with divergence plus one or scan output if last position;
  responsive to a determination that the latch at the position of the shift with divergence plus one or scan output if last changes consistently with the potentially divergent latch, identifying the potentially divergent latch as the scan path latch that feeds the scan output of the given scan chain.

15. The computer program product of claim 9, wherein the computer readable program is stored in a computer readable storage medium in a data processing system and wherein the computer readable program was downloaded over a network from a remote data processing system.

16. The computer program product of claim 9, wherein the computer readable program is stored in a computer readable storage medium in a server data processing system and wherein the computer readable program is downloaded over a network to a remote data processing system for use in a computer readable storage medium with the remote system.

17. An apparatus, comprising:
 a processor; and
 a memory coupled to the processor, wherein the memory comprises instructions which, when executed by the processor, cause the processor to:
 initialize all potential scan chain latches in a high-level integrated circuit model;
 for each scan chain, identify latches in the scan chain;
 separate each scan chain into groups of latches, wherein each group of latches is a sub-portion of its respective scan chain;
 for each group of latches in a given scan chain, identify latches that change after each shift until all groups of latches in the given scan chain are defined and ordered; and
 responsive to the data processing system determining that a divergence occurs for the given scan chain, isolate a scan path latch for each shift with a divergence in the given scan chain.

18. The apparatus of claim 17, wherein separating a given scan chain into groups of latches comprises:
 changing a logic value at a scan input of the given scan chain;
 shifting the given scan chain a predetermined number of times, wherein the predetermined number is a predetermined chunk size;
 identifying latches that changed to be a group of latches; and
 repeating shifting the given scan chain the predetermined number of times and identifying latches that changed until the given scan chain has been shifted.

19. The apparatus of claim 17, wherein identifying latches that change after each shift in a given scan chain comprises:
 changing a logic value at a scan input of the given scan chain;
 for each group of latches in the given scan chain, shifting the given scan chain, comparing the group of latches to identify one or more changed latches, and updating a definition of the given scan chain to order latches in the given scan chain to form an updated scan chain definition; and
 storing the updated scan chain definition for the given scan chain.

20. The apparatus of claim 17, wherein isolating a scan path latch for each shift with a divergence in the given scan chain comprises:
 starting at a scan output of the given scan chain;
 for each shift with a divergence, and for each potentially divergent latch:
  setting the potentially divergent latch to a first logic value;
  pulsing scan clocks in the given scan chain;
  checking a state of a latch at a position of the shift with divergence plus one or scan output if last position;
  setting the potentially divergent latch to a second logic value;
  pulsing scan clocks in the given scan chain;
  checking the state of the latch at the position of the shift with divergence plus one or scan output if last position;
  responsive to a determination that the latch at the position of the shift with divergence plus one or scan output if last changes consistently with the potentially divergent latch, identifying the potentially divergent latch as the scan path latch that feeds the scan output of the given scan chain.

* * * * *